(12) United States Patent
Lin

(10) Patent No.: US 6,741,522 B1
(45) Date of Patent: May 25, 2004

(54) METHODS AND STRUCTURE FOR USING A HIGHER FREQUENCY CLOCK TO SHORTEN A MASTER DELAY LINE

(75) Inventor: Shuaibin Lin, Broomfield, CO (US)

(73) Assignee: LSI Logic Corporation, Milpitas, CA (US)

( * ) Notice: Subject to any disclaimer, the term of this patent is extended or adjusted under 35 U.S.C. 154(b) by 382 days.

(21) Appl. No.: 09/996,122

(22) Filed: Nov. 27, 2001

(51) Int. Cl.[7] .............................. G04F 1/00; G03L 7/00; G06F 1/04
(52) U.S. Cl. ...................... 368/118; 368/120; 327/141; 327/145; 327/161; 327/261; 327/291; 327/295
(58) Field of Search ................................. 368/113, 118, 368/120; 327/141, 145, 161, 291, 295

(56) References Cited

U.S. PATENT DOCUMENTS 4,982,387 A * 1/1991 Trent .......................... 368/117
6,304,119 B1 * 10/2001 Tseng et al. ................. 327/161
6,359,483 B1 * 3/2002 Watkins et al. .............. 327/158
6,581,017 B2 * 6/2003 Zumkehr ..................... 702/107

* cited by examiner

*Primary Examiner*—Vit W. Miska

(57) ABSTRACT

Methods and structure for improving accuracy of a master delay line associated with slave delay lines wherein the master delay line is design utilizing a higher clock frequency then the clock frequency applied to associated slave delay lines. The higher clock frequency applied to the master delay line in accordance with the present invention permits the master delay line to be comprised of fewer delay elements than would be the case for a master delay line using the same basic clock frequency as associated slave delay lines. The lower number of delay elements comprising the master delay line (i.e., the shorter length of the master delay line) helps reduce static phase errors associated with the master delay line inherent in the design, layout and fabrication of a longer delay line.

10 Claims, 3 Drawing Sheets

METHODS AND STRUCTURE FOR USING A HIGHER FREQUENCY CLOCK TO SHORTEN A MASTER DELAY LINE

BACKGROUND OF THE INVENTION

1. Field of the Invention

The present invention relates to digital circuit designs utilizing delay lines for phase offset generation and comparison and more specifically relates to use of higher frequency clocks applied to a master delay lines used for calibrating associated slave delay lines. The higher frequency clock used with the master delay line permits shortening of the master delay line thereby improving its accuracy.

2. Discussion of Related Art

In most present in digital electronic circuits, clock signals are used to control and synchronize operation of the digital components to achieve the intended purpose, Clock signals inherently have an associated clock frequency and clock period. In a variety of digital circuit applications, it is necessary to generate desired phase offset relationships between signals associated with a common clock. For example, a first signals may be generated using a first phase relationship to a basic system clock while a second related signal may be generated with a second phase relationship from either the first signal or the common basic system clock. Similarly, it is often required that phase relationships be measured to detect relevant or desired phase relationships between two signals relative to a common system clock.

In generating or detecting such phase relationships relative to a basic system clock, it is common to use delay lines to establish a desired phase relationship delay between associated edges of the related digital signals. Such delay lines are comprised of a plurality of sequential delay elements each of which delays an input signal a predetermined fixed fraction of a clock period of the basic system clock from which the phase relationships are to be established. Each delay element of a plurality of delay elements is chained to a subsequent element (other than the final delay element). An appropriate number of such delay elements are chained together to create the desired delay necessary for achieving the desired phase relationship between a first signal and a second signal. For example, the first signal may be passed directly from the generating source to an intended recipient component whereas the second related signal is passed from its point of generation through an appropriate number of delay elements of a delay line and then on to its intended recipient component. The second signal being so delayed provides the desired phase relationship between the first and second signal.

Each delay element in such a chain of delay elements comprising a delay signal line has some inherent variability in its accuracy for imposing the specified delay amount. The design of digital circuits and the eventual layout and fabrication of a circuit having a delay line comprising multiple delay elements may impose further inaccuracies in the delay timing generated by such a delay line. For example, the layout of the delay elements in a particular delay line may introduce significant propagation delay between the chained delay elements of the delay line thus affecting the accuracy of the entire delay line.

It is generally known in the art to carefully layout and design circuits including delay line components so as to minimize the potential additional inaccuracy in such delay lines. Careful layout of a circuit design can help minimize propagation delays in a delay line. However, such care is difficult and often impractical in the design and fabrication of modern, complex integrated circuits. Further, the number of such delay lines in a complex integrated circuit may be substantial thereby further complicating any efforts to carefully layout and fabricate the circuit design so as to minimize propagation delays within delay line components.

One known technique for improving delay line accuracy is to provide a single delay line using the same delay elements as other delay lines but for which extra care is taken in the layout and fabrication so as to minimize additional inaccuracies in that particular delay line signal path. Such a carefully designed and fabricated delay line is often referred to as a "master delay line" or "reference delay line." The master delay line is then used in conjunction with calibration circuits to more precisely measure the delay required to achieve a particular desired phase relationship. Calibration information derived from such calibration circuits is then used in other operational delay lines within the circuit design to configure each operational delay line with reference to the more accurate master or reference delay line. These operational delay lines are often referred to as "slave delay lines" in that they are "slaved" to the master or reference delay line.

It remains a problem however to assure accuracy of even the master delay line. Even the most careful design layout and fabrication procedures may be inadequate to generate a highly precise master delay line. In particular, a long delay line (i.e., one comprised of a large number of delay elements) may entail unavoidable layout and fabrication problems. Regardless of the degree of care taken by the designer, a lengthy delay line may require compromises in circuit layout that may impose additional undesired inaccuracies in the master delay line.

It is evident from the above discussion that a need exists for methods and associated structure that provide additional accuracy in the design, layout and fabrication of master delay lines.

SUMMARY OF THE INVENTION

The present invention solves the above and other problems, thereby advancing the state of the useful arts, by providing methods and structure for the design of a master delay line using a higher frequency clock as compared to the base system clock used for associated slave delay lines. Use of a higher frequency clock in design of the master delay line permits the master delay line to be shortened by comparison to a master delay line using the same clock frequency as its associated slave delay lines. By so reducing the number of delay elements in the master delay line through use of the higher frequency clock, the accumulated inaccuracies (also referred to as "static errors" or "static phase errors") is further reduced. The shorter master delay line may be more carefully designed, laid out and fabricated to minimize static errors induced by delay line propagation delays.

Slave delay lines associated with functional components of the overall circuit design and calibrated to the master delay line of the present invention operate on a slower clock than that associated with the master delay line. The slave delay lines therefore include a scaling or gear factor to adjust the calibrated reference configuration information to timing parameters of the slower frequency clock signal.

It is common in present-day circuit designs that a number of clock signals are available within the circuit. In a particular area of the circuit design, operational delay lines (slave delay lines) often utilize a common clock as the basis for their signal delay generation for phase offset and sensing features. Other clocks are generally readily available within the circuit design including common integer multiples of the frequency of the base clock used in functional components of the circuit and associated with slave delay lines. In this sense, the methods and structure of the present invention are applicable in any digital design where slave delay lines are calibrated to a master delay line and where multiple clocks of varying frequencies are available within the circuit design.

In one particular exemplary preferred embodiment, a DDR (double data rate) SDRAM memory controller integrated circuit often has a clock running at double the frequency of a base clock used within the memory controller for clocking the external memory devices. Application of the methods and structure of the present invention within such a DDR SDRAM memory controller permits the master delay line to be designed based upon the double (2x) frequency clock while slave delay lines, typically utilizing identical delay elements and calibrated from the master delay line, operate based upon the base clock frequency. The calibration information derived from the higher clock frequency master delay fine is "geared" up to an appropriate configuration for the slower base clock frequency of the slave delay line. Such a design within a DDR SDRAM controller allows the master delay line to be approximately one-half the length of a master delay line devoid of the features of the present invention. The resulting reduction in the length of the master delay line enhances the accuracy of the master delay line by reducing accumulated static errors within the master delay line component. As noted, those skills in the art will recognize that a DDR SDRAM memory controller device is but one exemplary application of the methods and structure of the present invention. Further, those skills in the art will recognize that the higher frequency clock applied to the master delay line may be twice the base clock frequency as well as various other multiples, both integer and non-integer, of the base clock frequency.

A first aspect of the invention provides for a circuit comprising: a master delay line coupled to a first clock having a first clock frequency wherein the master delay line is comprised of a first plurality of delay elements; and a slave delay line used in conjunction with a second clock domain having a second clock frequency wherein the slave delay line is comprised of a second plurality of delay elements, wherein the first clock frequency is faster than the second clock frequency and wherein the slave delay line is calibrated to the master delay line.

A further aspect of the invention provides for master calibration logic for measuring a first number of delay elements of the first plurality of delay elements that in sequence provide a predetermined delay amount within the master delay line; and slave gear logic coupled to the master calibration logic for determining a second number of delay elements of the second plurality of delay elements that in sequence provide the predetermined delay amount within the slave delay line.

A still further aspect provides that the second clock frequency is a multiple of the first clock frequency and wherein the slave gear logic comprises: a multiplier to multiply the first number of delay elements by the multiple to determine the second number of delay elements.

In a second aspect, the invention provides a system comprising: a first clock having a first clock frequency; a master delay line coupled to the first dock and comprising a plurality of delay elements for selectively generating a predetermined master delay amount; master calibration logic coupled to the master delay line for providing a calibration value indicative or a number of delay elements selected within the master delay line to generate the predetermined master delay amount; and a plurality of slave components coupled to the master calibration logic wherein each slave component comprises: a slave delay line comprising a plurality of delay elements for selectively generating a predetermined slave delay amount; a second clock having a second clock frequency wherein the second clock frequency is less than the first clock frequency; slave functional circuits coupled to the second clock and coupled to the slave delay line to utilize the predetermined slave delay amount for generating a phase offset between a first signal and a second signal used within the slave functional circuits; and slave gear logic coupled to the master calibration logic and coupled to the slave delay line for determining from the calibration value a number of delay elements to be selected within the slave delay line to provide the predetermined slave delay amount.

Still another aspect of the invention provides a memory controller including: a first clock having a first clock frequency; a master delay line coupled to the first clock and comprising a plurality of delay elements for selectively generating a predetermined master delay amount; master calibration logic coupled to the master delay line for providing a calibration value indicative or a number of delay elements selected within the master delay line to generate the predetermined master delay amount; and a plurality of slave components coupled to the master calibration logic wherein each slave component comprises: a slave delay line comprising a plurality of delay elements for selectively generating a predetermined slave delay amount; a second clock having a second clock frequency wherein the second clock frequency is approximately half of the first clock frequency; slave functional circuits coupled to the second clock and coupled to the slave delay line to utilize the predetermined slave delay amount for generating a phase offset between a first signal and a second signal used within the slave functional circuits; and slave gear logic coupled to the master calibration logic and coupled to the slave delay line for determining from the calibration value a number of delay elements to be selected within the slave delay line to provide the predetermined slave delay amount.

Another aspect further provides that the slave gear logic comprises: a multiplier for multiplying the calibration value by two to determine the number of delay elements selected within the salve delay line to generate the predetermined slave delay amount.

In yet another aspect, the invention provides a method operable with a circuit having a first clock, a second clock, a master delay line coupled to the first clock and a slave component coupled to the second clock wherein the second clock has a lower frequency than the first clock and wherein the slave component includes a slave delay line, the method comprising the steps of: calibrating the master delay line to determine a calibration value indicating a number of delay elements within the master delay line required to generate a predetermined master delay amount; determining from the calibration value a corresponding number of delay elements within the slave delay line required to generate a predetermined slave delay amount; and selecting the number of delay elements within the slave delay line to generate the predetermined slave delay amount from the slave delay line.

Another aspect of the method provides that the step of determining includes the step of: multiplying the calibration value by a multiplier value to determine the number of delay elements within the slave delay line.

Still another aspect of the method provides that the step of multiplying includes the step of: multiplying the calibration value by a value substantially equal to the ratio of the first clock frequency to the second clock frequency.

DETAILED DESCRIPTION OF THE PREFERRED EMBODIMENTS

Figure 1:
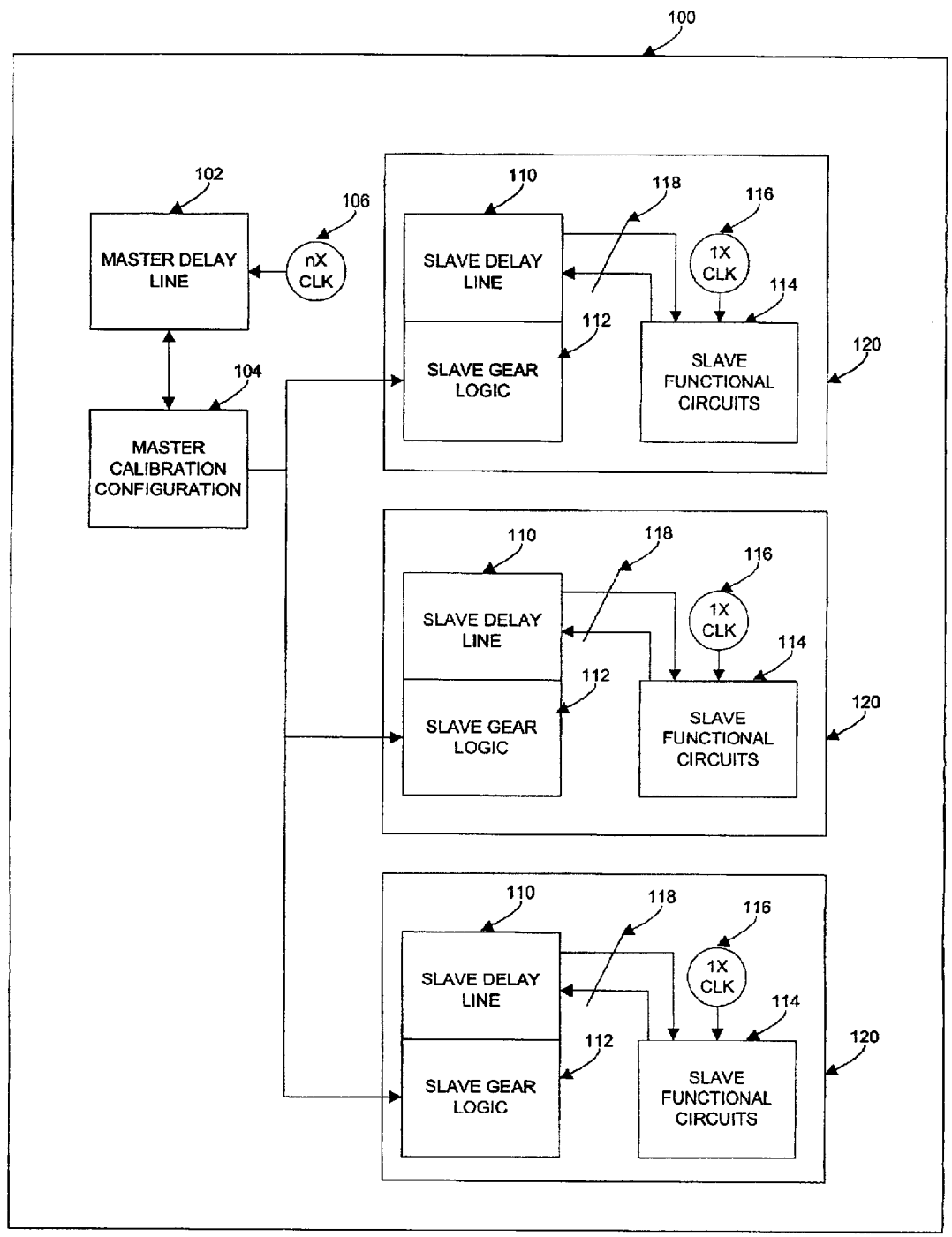
FIG. 1 is a block diagram of a circuit having a master delay line coupled to one or more slave delay lines wherein the master delay line is clocked at a faster frequency than the associated slave delay lines.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

In general, delay lines are often used in application circuit design to provide for desired phase offsets between signals or for detecting phase offsets between signals. In general, such delay lines combine a sequence of unit delay elements such that an input signal is applied to the input of delay line and passed through a selectable number of the delay elements to achieve the desired phase offset for generation or detection. Often the total delay of all delay elements in the delay line equals about one clock period of the applied clock signal. An appropriate number of the sequential delay elements is then selected (i.e., through a tap selection circuit) to achieve the desired predetermined delay amount corresponding to the phase offset of interest. The number of such delay elements in a delay line determines the granularity of any selection that may be allowed in the use of the delay line to achieve a particular delay amount.

As discussed above, it is vital for delay lines used for phase offset generation and detection to be accurately calibrated to account for static errors introduced by the design, layout and fabrication processes used for creating an application circuit. Further as noted above, one well-known technique for so calibrating delay line values is to provide for one master delay line that is carefully designed, laid out and fabricated to minimize static errors introduced by those processes. Such a highly accurate master delay line is then used to adjust associated slave delay lines to configure the slave delay lines as accurately as possible to generate the intended slave delay amount for a particular signal delay application.

In general, the accuracy of any delay line is improved using fewer delay elements to thereby simplify layout and fabrication of the delay line. A delay line using fewer delay elements is often referred to a "shorter" in length than one using a larger number of delay elements. A shorter delay line is more easily designed, laid out and fabricated in a linear fashion so as to reduce the impact of these processes on induced static errors in the application of the delay line signals. In accordance with the present invention, a master delay line used as a reference for other associated slave delay lines is clocked at a higher frequency than the associated slave delay lines to permit fewer delay elements to be used within the master delay line. Reducing the number of delay elements within the master delay line required for effectuating a predetermined delay amount improves the accuracy of the master delay line by reducing the impact of static errors induced by layout and fabrication procedures. This is because a shorter delay line permits a significant reduction in static errors imposed by non linearity in the layout and fabrication processes as compared to the same processes applied to longer delay lines.

FIG. 1 is a block diagram of a system 100 in accordance with the present convention having a master delay line 102 clocked at a higher frequency than associated slave components 120. Specifically, master delay line 102 is clocked by clock signal 106. Slave components 120 each included a slave delay line 110 clocked by clock signal 116. The clock frequency of clock 106 is higher than the clock frequency of clock 116. Clock 106 may be a multiple of clock 116. No specific multiplier value is required by the present invention. Rather, all that is required is that clock 106 associated with master delay line 102 has a higher frequency than the frequency of clock 116 applied to slave delay lines 110 within each slave component 120.

In one exemplary preferred embodiment, clock 106 has a frequency twice that of clock 116. Such a ratio of clock values happens to be generally available within DDR SDRAM memory controllers where both a standard clock frequency and a double clock frequency are available. Those skilled in the art will readily recognize that a variety of other applications of the present inventions are apparent where any higher clock frequency may be used to clock a master delay line 102 as compared to be clock frequency of a lower speed clock used to clock operational or slave delay lines 110 within each slave component 120. As shown in FIG. 1, the frequency of clock 106 is depicted as a multiple "n" of the frequency of clock 116. Further, those of ordinary skill in the art will recognize that each slave component 120 may utilize a different slower clock frequency. In other words, is not necessary that all slave components be clocked at the same lower clock speed only that some slave component coupled to master delay line 102 is clocked at some lower frequency. Slave gear logic 112 within each slave component and discussed further herein below adapts information derived from the master delay line 102 to adjust operation of slave delay line 110.

Master calibration and configuration element 104 is coupled to master within master delay line 102 required to achieve a delay amount equal to one period of the higher frequency clock applied to the master delay line. In other words, the number of delay elements to be selected in the master delay line to lock the master delay line to one clock period of the clock applied to the master delay line. In particular, master calibration and configuration element 104 determines a calibration value indicative of the number of delay elements within master delay line 102 required to achieve a delay amount equal to the period of clock 106 (the "calibrating clock").

This calibration value is applied to slave gear logic 112 within each slave component 120. Slave gear logic 112 within each slave component 120 then determines an equivalent number of delay elements to be selected within associated slave delay line 110 to achieve a predetermined, corresponding slave delay amount. The slave delay amount for each slave component 120 is determined in accordance with the required delay for the particular slave component 120 function (i.e., some fraction or multiple of the period of clock 116 applied to the slave functional circuits 114). Slave delay line 110 within slave component 120 so adapted by slave gear logic 112 then generates a required slave delay amount for application to slave functional circuits 114. The specific purpose of functional circuits 114 is unique to each particular application of an accurately determined delay amount. In general, some signal is applied by slave functional circuits 114 to slave delay line 110 via paths 118 and returned with the desired delay on paths 118. As noted, the particular signal within slave functional circuits 114 to be delayed and the amount of the delay applied by slave delay line 110 are a matter of design choice unique to the particular slave component 120.

Figure 2:
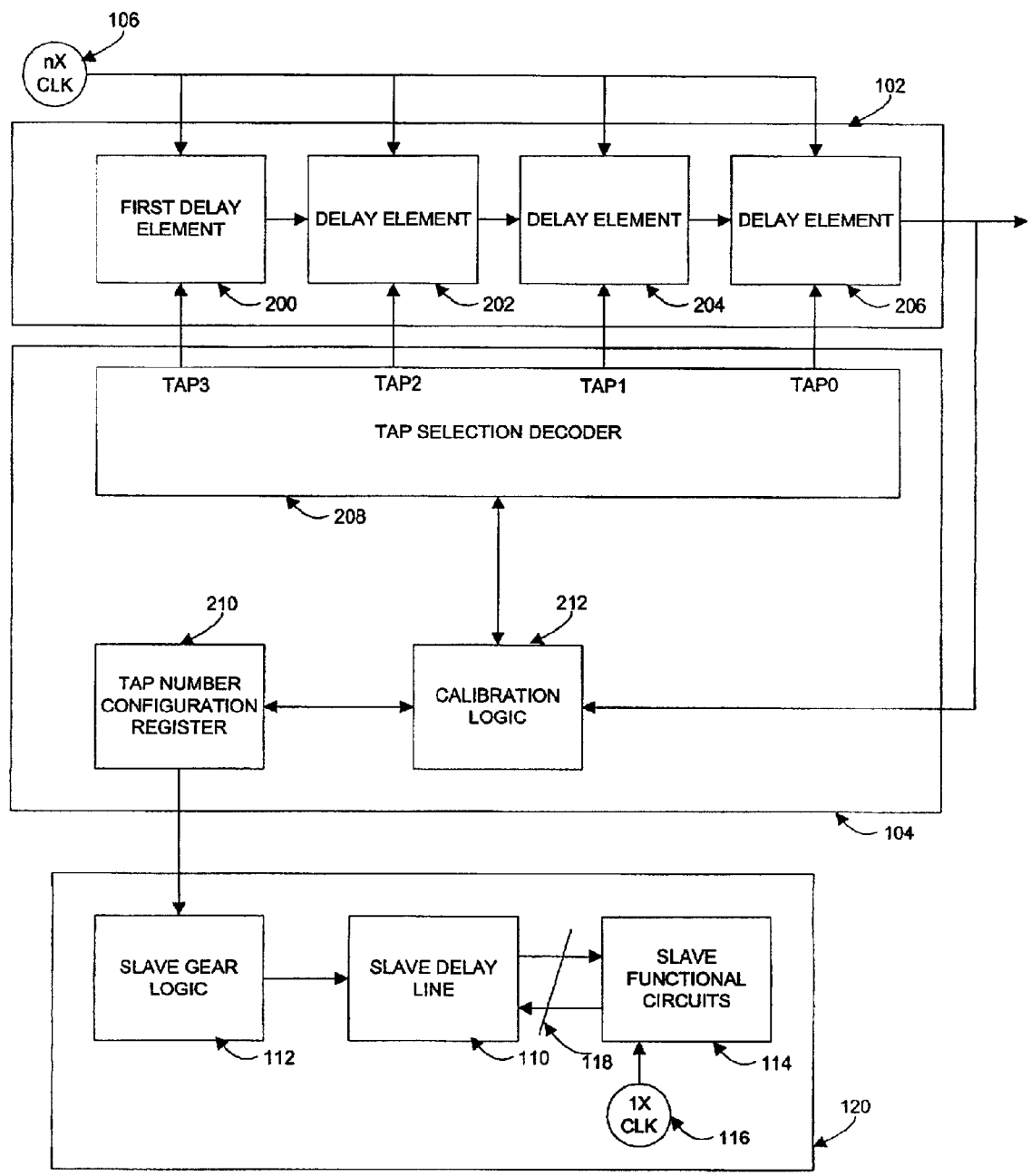
FIG. 2 is a block diagram providing additional details of the structure of a master delay line of the present invention and associated calibration logic in accordance with the present invention.

FIG. 2 is a block diagram providing additional details of the structure and operation of master delay line 102 and associated master calibration and configuration element 104. As noted above, master delay line 102 is clocked by clock signal 106 (having a higher frequency than clock signals applied to associated slave functional circuits). Master delay line 102 is comprised of a plurality of delay elements 200 through 206. Each delay elements 200 through 206 receives clock signal 106 as a first input signal and receives a selection control input signal from selection decoder 208. All but the first delay element 200 (e.g., delay elements 202 through 206) receive the output of the preceding delay element as a second input signal. Selection decoder 208 provides the input selection signal to each delay element indicating whether it should select clock signal 106 as its input or the output of the preceding delay element has its present input. Each delay element 200 through 206 then passes on its selected input signal by applying it to its corresponding output signal path delayed by a predetermined fixed unit delay amount. Tap decoder 208 receives a binary coded selection number from calibration logic 212 and applies the value as a corresponding selection signal (TAP0 through TAP3) to the identified delay elements 200 through 206. Those skilled in the art will recognize that any number of delay elements may be included in the master delay line with an associated tap signal generated by tap decoder 208. In fact, in practice, it is not uncommon for the delay elements to number in the thousands to achieve a desired level of granularity in selecting a predetermined delay amount.

Still more specifically, calibration logic 212 preferably iteratively tries all possible sequences of delay elements until a preferred number of delay elements is identified that most closely matches the desired predetermined master delay amount. Having so determined the appropriate number of delay elements required in delay line 102 to generate the desired predetermined master delay amount, calibration logic 212 preferably stores the value so determined in tap number configuration register 210.

Details of the structure and operation of such a delay line 102 and an associated calibration and configuration element 104 are well-known to those of ordinary skill in the art and therefore need not be presented in further detail herein.

As noted above, slave component 120 is clocked at some lower frequency than the master delay line by clock signal 116. Further as noted, although FIGS. 1 and 2 suggest an integral factor ratio between the clock frequency applied to the master delay line and that applied to the slave delay line, no such integer ratio is required. It is often the case that multiples of clock frequencies are available in a circuit design and therefore convenient to use such an integer multiple ration between the two clocks.

As discussed above with respect to FIG. 1, slave gear logic 112 receives the calibration value determined by master calibration and configuration component 104 and determines from the calibration value an appropriate number of delay elements to achieve the required slave delay amount in the slave delay line 110 of the corresponding slave component 120. In one exemplary preferred embodiment there exists an integer multiple ratio relationship between the frequencies of the master delay line clock signal and the slave delay line clock signal. In such a case, the configuration and calibration information provides the number of unit delay elements required in the master delay line to provide for a predetermined master delay amount "T." Slave gear logic 112 provides a simple arithmetic function to multiply the number of unit delay elements required in the master delay line by the ratio of the two clock frequencies to thereby determine the number of unit delay elements within the slave delay line required to provide a predetermined slave delay amount. Further simple multiplications or divisions are performed by slave gear logic 112 to determine the particular fraction or multiple of a clock period required for the desired slave delay amount.

Those skilled in the art will recognize a wide range of equivalent functions performed by slave gear logic 112 to determine the number of delay elements required in the slave delay line based upon calibration information provided by master calibration and configuration element 104. In general, slave gear logic scales the number of master delay line delay elements required to a corresponding number in the slave delay line taking into account the higher clock frequency of the master delay line (among other factors). The scaling need not be by integer multiples.

Though strongly preferred and common practice in the art, it is not necessary that the delay elements used in the slave delay lines are identical to that of the master delay lines. Further complexities incorporated in slave gear logic 112 could adjust for the differences in choice of delay elements used in a slave delay line as compared to a master delay line used to calibrate the slave delay line. Key to the invention is that the master delay line uses a higher frequency clock as compared to slave functional components and their associated slave delay lines to thereby shorten the master delay line relative to the slave delay lines. The shorter master delay line is therefore less prone to static errors induced by layout and fabrication of lengthier delay lines.

Further, it is not necessary for every slave component 120 to be clocked at the same frequency. Each slave component preferably includes a slave gear logic element 112 to determine from supplied master calibration information an appropriate number of delay elements in its associated slave delay line 110 to achieve the desired slave delay amount. Though each slave component in FIG. 1 is shown as using a 1×clock signal 116, each slave component 120 could have its own unique clock frequency such that the slave gear logic 112 adapts the corresponding slave delay line 110 as needed for the signal to be delayed in the slave component and as needed for the specific frequency of the slave clock 116 in the slave component 120.

Figure 3:
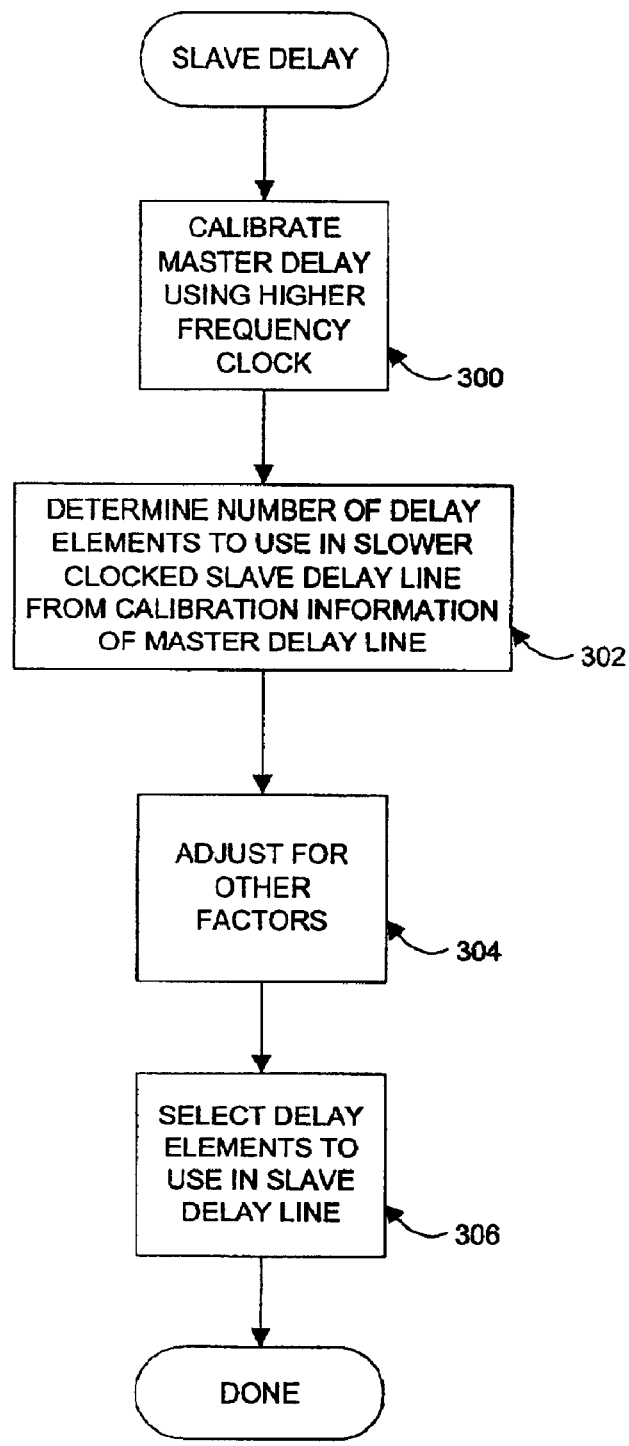
FIG. 3 is a flowchart describing the method of the present invention to calibrate the master delay line using a higher frequency clock.

FIG. 3 is a flowchart describing a method of the present invention to calibrate a master delay line using a higher clock frequency and to gear or adapt the configuration of the master delay line to the needs of a particular slave delay line.

Element 300 represents the processing required within the master delay line and associated calibration and configuration elements to determine the number of delay elements required in the master delay line to generate a predetermined master delay amount. Element 302 then adapts this calibration value (i.e., the number of delay elements in the master delay line) to the needs of the associated slave delay line. This function gears or transforms the number of delay elements required by the master delay line for a predetermined master delay amount to the number of delay elements in the slave delay line required to generate a predetermined slave delay amount. The principle factors involved in this determination are the particular delay amount required for the corresponding slave component and the ratio of the higher frequency clock used in the master delay line to the lower frequency clock used in the corresponding slave delay line. Element 304 then adjusts this number so determined for any other factors. For example, as noted above, the unit delay elements in the slave delay line could provide different unit delay amounts, the slave delay amount could be different than the master delay amount. Lastly, the number of slave delay elements so determined is then selected in the slave delay line to generate the required predetermined slave delay amount.

The determination of the number of slave delay elements from the calibration of the master delay line could be as simple as multiplying the number of delay elements selected in the master delay line as calibrated for a master delay amount by the ratio of the clock frequencies. Other equivalent techniques will be readily apparent to those skilled in the art.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. A circuit comprising:
    a master delay line coupled to a first clock having a first clock frequency wherein said master delay line is comprised of a first plurality of delay elements; and
    a slave delay line used in conjunction with a second clock domain having a second clock frequency wherein said slave delay line is comprised of a second plurality of delay elements,
    wherein said first clock frequency is faster than said second clock frequency and wherein said slave delay line is calibrated to said master delay line.

2. The circuit of claim 1 further comprising:
    master calibration logic for measuring a first number of delay elements of said first plurality of delay elements that in sequence provide a predetermined delay amount within said master delay line; and
    slave gear logic coupled to said master calibration logic for determining a second number of delay elements of said second plurality of delay elements that in sequence provide said predetermined delay amount within said slave delay line.

3. The circuit of claim 2 wherein said second clock frequency is a multiple of said first clock frequency and wherein said slave gear logic comprises:
    a multiplier to multiply said first number of delay elements by said multiple to determine said second number of delay elements.

4. A system comprising:
    a first clock having a first clock frequency;
    a master delay line coupled to said first dock and comprising a plurality of delay elements for selectively generating a predetermined master delay amount;
    master calibration logic coupled to said master delay line for providing a calibration value indicative or a number of delay elements selected within said master delay line to generate said predetermined master delay amount; and
    a plurality of slave components coupled to said master calibration logic wherein each slave component comprises:
        a slave delay line comprising a plurality of delay elements for selectively generating a predetermined slave delay amount;
        a second clock having a second clock frequency wherein said second dock frequency is less than said first clock frequency;
        slave functional circuits coupled to said second clock and coupled to said slave delay line to utilize said predetermined slave delay amount for generating a phase offset between a first signal and a second signal used within said slave functional circuits; and
        slave gear logic coupled to said master calibration logic and coupled to said slave delay line for determining from said calibration value a number of delay elements to be selected within said slave delay line to provide said predetermined slave delay amount.

5. The system of claim 4 wherein said slave gear logic comprises:
    a multiplier for multiplying said calibration value by a predetermined value to determine said number of delay elements selected within said salve delay line to generate said predetermined slave delay amount.

6. A memory controller including:
    a first clock having a first clock frequency;
    a master delay line coupled to said first clock and comprising a plurality of delay elements for selectively generating a predetermined master delay amount;
    master calibration logic coupled to said master delay line for providing a calibration value indicative or a number of delay elements selected within said master delay line to generate said predetermined master delay amount; and
    a plurality of slave components coupled to said master calibration logic wherein each slave component comprises:
        a slave delay line comprising a plurality of delay elements for selectively generating a predetermined slave delay amount;
        a second clock having a second clock frequency wherein said second clock frequency is approximately half of said first clock frequency;
        slave functional circuits coupled to said second clock and coupled to said slave delay line to utilize said predetermined slave delay amount for generating a phase offset between a first signal and a second signal used within said slave functional circuits; and
        slave gear logic coupled to said master calibration logic and coupled to said slave delay line for determining from said calibration value a number of delay elements to be selected within said slave delay line to provide said predetermined slave delay amount.

7. The memory controller of claim 6 wherein said slave gear logic comprises:
    a multiplier for multiplying said calibration value by two to determine said number of delay elements selected within said salve delay line to generate said predetermined slave delay amount.

8. A method operable with a circuit having a first clock, a second clock, a master delay line coupled to said first clock and a slave component coupled to said second clock wherein said second clock has a lower frequency than said first clock and wherein said slave component includes a slave delay line, said method comprising the steps of:

calibrating said master delay line to determine a calibration value indicating a number of delay elements within said master delay line required to generate a predetermined master delay amount;

determining from said calibration value a corresponding number of delay elements within said slave delay line required to generate a predetermined slave delay amount; and selecting said number of delay elements within said slave delay line to generate said predetermined slave delay amount from said slave delay line.

9. The method of claim 8 wherein the step of determining includes the step of:

multiplying said calibration value by a multiplier value to determine said number of delay elements within said slave delay line.

10. The method of claim 9 wherein the step of multiplying includes the step of:

multiplying said calibration value by a value substantially equal to the ratio of said first clock frequency to said second clock frequency.

* * * * *